United States Patent
Murakami et al.

(10) Patent No.: US 11,177,116 B2
(45) Date of Patent: Nov. 16, 2021

(54) BEAM INTENSITY CONVERTING FILM, AND METHOD OF MANUFACTURING BEAM INTENSITY CONVERTING FILM

(71) Applicant: Kaneka Corporation, Osaka (JP)

(72) Inventors: Mutsuaki Murakami, Osaka (JP); Atsushi Tatami, Osaka (JP); Masamitsu Tachibana, Osaka (JP)

(73) Assignee: KANEKA CORPORATION, Osaka (JP)

(*) Notice: Subject to any disclaimer, the term of this patent is extended or adjusted under 35 U.S.C. 154(b) by 501 days.

(21) Appl. No.: 16/080,642

(22) PCT Filed: Apr. 20, 2017

(86) PCT No.: PCT/JP2017/015890
§ 371 (c)(1),
(2) Date: Aug. 28, 2018

(87) PCT Pub. No.: WO2017/188117
PCT Pub. Date: Nov. 2, 2017

(65) Prior Publication Data
US 2019/0088450 A1 Mar. 21, 2019

(30) Foreign Application Priority Data
Apr. 28, 2016 (JP) .............................. JP2016-090934

(51) Int. Cl.
*G02B 5/22* (2006.01)
*H01J 37/32* (2006.01)
(Continued)

(52) U.S. Cl.
CPC ............ *H01J 37/3233* (2013.01); *G02B 5/20* (2013.01); *G21K 1/02* (2013.01); *G21K 1/10* (2013.01); *H01J 37/3488* (2013.01)

(58) Field of Classification Search
CPC .... H01J 37/3233; H01J 37/3488; G21K 1/10; G21K 1/02; G21K 1/00; G21K 2201/00;
(Continued)

(56) References Cited

U.S. PATENT DOCUMENTS

| 5,920,601 A | 7/1999 | Nigg et al. |
| 2006/0040064 A1 | 2/2006 | Dombsky et al. |

(Continued)

FOREIGN PATENT DOCUMENTS

| EP | 1661856 A1 | 5/2006 |
| EP | 3285264 A1 | 2/2018 |

(Continued)

OTHER PUBLICATIONS

Kaneka (Electrical and electronic materials, Date:2010, p. 1) (Year: 2010).*

(Continued)

*Primary Examiner* — Stephone B Allen
*Assistant Examiner* — Jyotsna V Dabbi
(74) *Attorney, Agent, or Firm* — Osha Bergman Watanabe & Burton LLP

(57) ABSTRACT

A beam intensity converting film that has sufficient shielding property, sufficient durability, and sufficient heat resistance and that can reduce the extent of radioactivation. An attenuator is constituted by a graphite film placed such that a surface thereof intersects the beam axis of a charged particle beam, the graphite film has a thickness of 1 μm or greater, and the thermal conductivity in a surface direction of the graphite film is equal to or greater than 20 times the thermal conductivity in the thickness direction of the graphite film.

8 Claims, 1 Drawing Sheet

(51) Int. Cl.
*G02B 5/20* (2006.01)
*H01J 37/34* (2006.01)
*G21K 1/10* (2006.01)
*G21K 1/02* (2006.01)

(58) Field of Classification Search
CPC ....... G21K 2201/062; G21K 2201/067; G21K 2201/068; G21K 5/04; G21K 3/00; G02B 5/02; G02B 5/003; G02B 5/201; G02B 5/22; H05H 2007/004; H05H 7/12; H05H 7/125; B32B 2307/20; B32B 2307/30; B32B 2307/00; C01B 32/20; C01B 32/205; A61N 5/10; A61N 5/1001; A61N 5/1048; A61N 5/1077; A61N 2005/1092; A61N 2005/1094; A61N 2005/1095
USPC ......................................................... 359/885
See application file for complete search history.

(56) References Cited

U.S. PATENT DOCUMENTS

| | | |
|---|---|---|
| 2007/0297554 A1 | 12/2007 | Lavie et al. |
| 2008/0286541 A1 | 11/2008 | Zeisler et al. |
| 2009/0286057 A1 | 11/2009 | Zeisler et al. |
| 2013/0064338 A1 | 3/2013 | Matsumoto et al. |
| 2013/0170593 A1 | 7/2013 | Jansen et al. |
| 2013/0213630 A1 | 8/2013 | Southard, II |
| 2013/0279638 A1 | 10/2013 | Matsumoto et al. |
| 2013/0280470 A1 | 10/2013 | Norly |
| 2014/0029710 A1 | 1/2014 | Wilson et al. |
| 2014/0091238 A1 | 4/2014 | Miyashita et al. |
| 2015/0003576 A1 | 1/2015 | Uhland et al. |
| 2015/0170780 A1 | 6/2015 | Miyashita et al. |
| 2016/0249453 A1 | 8/2016 | Tatami et al. |
| 2016/0324031 A1 | 11/2016 | Fujiwara |
| 2017/0021387 A1 | 1/2017 | Lin et al. |
| 2017/0169908 A1 | 6/2017 | Andrighetto et al. |

FOREIGN PATENT DOCUMENTS

| | | |
|---|---|---|
| EP | 3385956 A1 | 10/2018 |
| EP | 3447773 A1 | 2/2019 |
| JP | H08222239 A | 8/1996 |
| JP | H09142820 A | 6/1997 |
| JP | 2999381 B2 | 1/2000 |
| JP | 2004079304 A | 3/2004 |
| JP | 2004535288 A | 11/2004 |
| JP | 2005326299 A | 11/2005 |
| JP | 2006196353 A | 7/2006 |
| JP | 2007101367 A | 4/2007 |
| JP | 2008501612 A | 1/2008 |
| JP | 2009530493 A | 8/2009 |
| JP | 2011063509 A | 3/2011 |
| JP | 2012119062 A | 6/2012 |
| JP | 2012186012 A | 9/2012 |
| JP | 2012243640 A | 12/2012 |
| JP | 2012249940 A | 12/2012 |
| JP | 2013054889 A | 3/2013 |
| JP | 2013525744 A | 6/2013 |
| JP | 3185065 U | 8/2013 |
| JP | 3186199 U | 9/2013 |
| JP | 2013206726 A | 10/2013 |
| JP | 2013216577 A | 10/2013 |
| JP | 2013238515 A | 11/2013 |
| JP | 2014517258 A | 7/2014 |
| WO | 2002099816 A2 | 12/2002 |
| WO | 2015045641 A1 | 4/2015 |
| WO | 2015072428 A1 | 5/2015 |
| WO | 2015173098 A1 | 11/2015 |

OTHER PUBLICATIONS

"KANEKA Electrical and electronic materials—Typical properties-" 2010, (XP055577880) (1 page).
"KANEKA Electrical and electronic materials—Flexibility and electromagnetic sheilding effect-" 2010, (XP055577878) (1 page).
Y. Kaburagi et al.: "Thermal and electrical conductivity and magnetoresistance of graphite films prepared from aromatic polyimide films" Jan. 1, 2012, No. 253, pp. 106-115, (XP055576634) (10 pages).
Laird Heatspreader: High Thermal Conductive Graphite Sheet, Apr. 28, 2015 (XP055576976) (1 page).
High Thermal Conductive Graphite Sheet Preliminary (XP055576937) (2 pages).
Extended European Search Report issued in European Application No. 17789400.3, dated Apr. 18, 2019 (12 pages).
International Search Report issued in International Application No. PCT/JP2017/015890; dated Jul. 18, 2017 (2 pages).
International Preliminary Report on Patentability issued in International Application No. PCT/JP2017/015890; dated Nov. 8, 2018 (6 pages).
Restriction Requirement issued in corresponding U.S. Appl. No. 16/077,377, dated Sep. 21, 2020 (21 pages).
Office Action issued in corresponding U.S. Appl. No. 16/077,377, dated Dec. 4, 2020 (14 pages).
Office Action issued in corresponding U.S. Appl. No. 16/077,377, dated Mar. 8, 2021 (8 pages).
Restriction Requirement issued in corresponding U.S. Appl. No. 16/092,986, dated Jun. 16, 2020 (9 pages).
International Search Report issued in International Application No. PCT/JP2017/015932, dated Jul. 18, 2017 (2 pages).
International Preliminary Report on Patentability issued in International Application No. PCT/JP2017/015932, dated Nov. 1, 2018 (9 pages).
Extended European Search Report issued in corresponding European Application No. 17786034.3; dated Apr. 4, 2019 (7 pages).
Office Action issued in corresponding Japanese Application No. 2018-513215; dated Jun. 11, 2019 (13 pages).
International Search Report issued in International Application No. PCT/JP2017/015906, dated Jul. 25, 2017 (2 pages).
International Preliminary Report on Patentability issued in International Application No. PCT/JP2017/015906, dated Nov. 1, 2018 (7 pages).
Keikiaku, ""PGS" Graphite Sheets," Nov. 7, 2015, XP055556674, retrieved from the Internet on Feb. 14, 2019: URL:https://eu.mouser.com/ds/2/315/AYA0000CE2-64434.pdf (10 pages).
Extended European Search Report issued in European Patent Application No. 17786030.1; dated Feb. 25, 2019 (8 pages).
Office Action issued in corresponding Japanese Application No. 2018-513212; dated Jul. 9, 2019 (10 pages).

* cited by examiner

BEAM INTENSITY CONVERTING FILM, AND METHOD OF MANUFACTURING BEAM INTENSITY CONVERTING FILM

TECHNICAL FIELD

The present invention relates to a beam intensity converting film and a method of producing a beam intensity converting film.

BACKGROUND ART

Accelerators such as a cyclotron, which produce various charged particle beams, are required to carry out size adjustment of charged particle beams and control of beam intensity within a wide range. For satisfying such requirements, a beam intensity converting film having an opening, such as a scraper to reduce the size of a charged particle beam or an attenuator to attenuate the intensity of a charged particle beam, is used.

For example Patent Literature 1 discloses an attenuator constituted by a metal mesh, which serves as a moderator for slow positron generation. The metal mesh is composed of tungsten.

Patent Literature 2 discloses a self-supporting multilayer film that includes both: non-diamond-like carbon such as carbon in the form of graphite or amorphous carbon; and diamond-like carbon.

Furthermore, as a material constituting a beam intensity converting film, titanium and the like are known in addition to the foregoing tungsten.

CITATION LIST

Patent Literature

[Patent Literature 1]
Japanese Patent Application Publication, Tokukai, No. 2005-326299
[Patent Literature 2]
Published Japanese Translation of PCT International Application, Tokuhyo, No. 2009-530493

SUMMARY OF INVENTION

Technical Problem

However, the conventional techniques as described above have the following issues: (1) durability of an intensity converting film against charged particle beams is low; and (2) some means is needed to reduce the extent of radioactivation, due to a charged particle beam, of the intensity converting film and apparatuses near the film.

Generally, as a beam intensity converting film, a film made of a metal such as titanium or tungsten is often used from the viewpoint of durability and heat resistance, or a carbon material is often used from the viewpoint that the carbon materials do not easily become radioactive. The term "becomes radioactive (radioactivation)" as used herein means not only that an intensity converting film itself becomes radioactive but also that an apparatus near the beam intensity converting film becomes radioactive due to a reflected beam from the beam intensity converting film. The beam intensity converting film and apparatuses near the beam intensity converting film, which have become highly radioactive, cannot be handled by humans. Therefore, it is necessary to stop the accelerator and replace the beam intensity converting film before the intensity converting film becomes too radioactive. This leads to a substantial decrease in operating time of the accelerator.

Furthermore, beam intensity converting films (such as attenuator and scraper) in an accelerator are required to be highly durable against temperature rise resulting from beam irradiation. For example, the required durability of the attenuator varies depending on location and/or open area ratio, and the replacement frequency of the beam intensity converting film of the attenuator also varies. For example, an attenuator composed of amorphous carbon and having an open area ratio of 50% becomes damaged in a very short period of time by uranium beam irradiation, and thus the converting film needs to be replaced very frequently. The increased replacement frequency leads to a substantial decrease in operating time of the accelerator.

Such an issue concerning the durability of an intensity converting film against charged particle beams is a major issue particularly in a case where the beam intensity converting film is composed of a carbon material such as that disclosed in Patent Literature 2. That is, the greatest issue that the beam intensity converting film composed of carbon faces is about its durability.

The present invention was made in view of the above issues, and an object thereof is to obtain a beam intensity converting film that is capable of reducing the extent of radioactivation, that is composed of carbon, and that is sufficiently durable against charged particle beams, and a method of producing a beam intensity converting film.

Solution to Problem

A beam intensity converting film of one aspect of the present invention is a beam intensity converting film having an opening that allows passage of a charged particle beam, the beam intensity converting film including one or more graphite films placed such that a surface thereof intersects a beam axis of the charged particle beam, wherein the one or more graphite films each have a thickness of 1 μm or greater, and wherein, in the one or more graphite films, a thermal conductivity in a surface direction is equal to or greater than 20 times a thermal conductivity in a thickness direction.

A beam intensity converting film of another aspect of the present invention is a beam intensity converting film having an opening that allows passage of a charged particle beam, the beam intensity converting film including one or more graphite films placed such that a surface thereof intersects a beam axis of the charged particle beam, wherein the one or more graphite films each have a thickness of 1 μm or greater, and wherein, in the one or more graphite films, an electric conductivity in a surface direction is equal to or greater than 100 times an electric conductivity in a thickness direction.

A method of producing a beam intensity converting film of still another aspect of the present invention is a method of producing a beam intensity converting film having an opening that allows passage of a charged particle beam, the beam intensity converting film including one or more graphite films, the method including a step of preparing the one or more graphite films by firing one or more polymeric films.

Advantageous Effects of Invention

An aspect of the present invention provides the following effect: it is possible to provide a beam intensity converting film that is sufficiently durable against charged particle beams and that is capable of reducing the extent of radioactivation.

BRIEF DESCRIPTION OF DRAWINGS

FIG. 1 is a front view showing the surface from which a charged particle beam travels outward.

DESCRIPTION OF EMBODIMENTS

Figure 1:
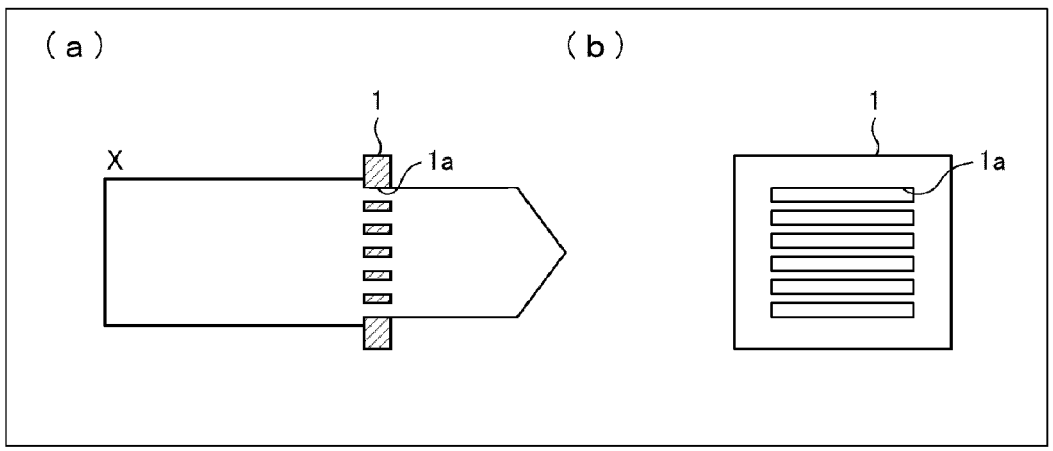
FIG. 1 schematically illustrates an attenuator serving as a beam intensity converting film in accordance with Embodiment 1 of the present invention. (a) of FIG. 1 is a cross-sectional view, and (b)

As described earlier, a carbon material such as amorphous carbon, which is said to become radioactive only to a relatively small extent, has been sometimes used as a beam intensity converting film having an opening that allows passage of a charged particle beam, conventionally. However, a beam intensity converting film prepared using amorphous carbon as a raw material is far from satisfactory in terms of durability. When a charged particle beam is incident on a beam intensity converting film, the beam intensity converting film experiences a very large heat load. For example, a beam intensity converting film composed of amorphous carbon and having an open area ratio of 50% is damaged almost instantly upon irradiation with a high-energy uranium beam.

In addition, amorphous carbon films have low mechanical strength, and therefore require some arrangement such as combining an amorphous carbon film with a diamond-like carbon (DLC) film or the like to from a multilayer film in order to serve as self-supporting films. In a preparation example of such a multilayer film, as disclosed in Patent Literature 2, the following complicated processes are necessary: (i) a water-soluble release layer is formed on a polished substrate; (ii) an amorphous carbon layer is deposited; (iii) a DLC layer is deposited, (iv) an amorphous carbon layer is deposited, (v) the multilayer film is removed from the substrate in water; (vi) the multilayer film is dried, and the like.

Under such circumstances, the inventors worked hard in an attempt to develop a beam intensity converting film that has excellent self-supporting property and excellent mechanical strength despite being made of carbon and that is highly durable to withstand the above-mentioned heat load.

As a result, the inventors succeeded in developing a beam intensity converting film that has excellent self-supporting property and excellent mechanical strength, that is sufficiently durable against heat load, and that is capable of reducing the extent of radioactivation, by employing graphite having specific properties and a specific thickness.

First of all, given the fact that an intensity converting film for an accelerator is mainly used in vacuum, the inventors arrived at the present invention by employing graphite that has high crystallinity and high orientation in order that: the graphite can have high heat resistant characteristics at temperatures equal to and above 3000° C. in vacuum; and the thermal conductivity characteristics in a surface direction of the intensity converting film or the electric conductivity characteristics in the surface direction of the intensity converting film can have at least a certain degree of anisotropy. Furthermore, the inventors found that is possible to achieve sufficient shielding property against charged particle beams and sufficient mechanical property by employing the above graphite film having physical property values of thermal conductivity and electric conductivity falling within certain ranges and having a thickness falling within a certain range. On the basis of this finding, the inventors accomplished the present invention.

The extent of radioactivation of a beam intensity converting film and the extent of beam reflection by the intensity converting film are related to a material (element) from which the beam intensity converting film is made. For example, use of carbon (atomic number: 12), which is a light element, reduces the extent of radioactivation of the beam converting film itself and the extent of charged particle beam reflection, as compared to titanium (atomic number: 22) and tungsten (atomic number: 74). Furthermore, the inventors conducted a study and obtained a new finding that the extent of charged particle beam reflection is also related to the temperature of the beam intensity converting film, and that a higher temperature of the beam intensity converting film cause a greater extent of charged particle beam reflection. That is, a beam intensity converting film increases in temperature in response to charged particle beam irradiation, and this temperature rise causes the beam intensity converting film to reflect the charged particle beam to a greater extent. On the other hand, it is inferred that, if it is possible to prevent or reduce the temperature rise of the beam intensity converting film, it will be possible to reduce charged particle beam reflection.

That is, the inventors made a new finding that a graphite film of the present invention can reduce the extent to which apparatuses near the graphite film become radioactive, as compared not only to metal films such as conventionally used titanium and tungsten but also to amorphous carbon films. As described earlier, the effect "a graphite intensity converting film of the present invention, which consists only of elemental carbon, is superior to metal films such as titanium and tungsten in terms of reducing radioactivation" is an effect brought about by the constituent element of the film, and thus is a predictable effect. The graphite film of the present invention, however, is capable of reducing the extent to which apparatuses near the graphite film become radioactive, even when compared to amorphous carbon films. This effect is brought about by the earlier-mentioned finding that the extent of charged particle beam reflection by a beam intensity converting film is dependent on temperature rise of the film. That is, this effect is brought about by the totally new finding that, if it is possible to keep the temperature of a beam intensity converting film low, it will be possible to reduce the reflection of a charged particle beam from the intensity converting film. The graphite film of the present invention is characterized in that it is not only superior in thermal conductivity and thus in thermal diffusion performance to amorphous carbon films, but also dissipates much heat through a radiation mechanism, and therefore the temperature of the graphite film itself does not rise easily. Accordingly, it is possible to reduce the charged particle beam reflection and to reduce the extent to which apparatuses near the graphite film become radioactive. The technical idea of the present invention based on the above finding is not the one that is predictable from conventional findings, but the one that has been accomplished by the inventors themselves.

In a case where the intensity of a charged particle beam such as an ion beam is to be controlled at a desired intensity, it is preferable that the thickness of a graphite film required to shield against the beam, and an opening that allows passage of the beam, are precisely controlled depending on the intensity of the charged particle beam. According to the present invention, it is possible to prepare a graphite film of any thickness, and the graphite film has excellent mechanical strength and thus it is easy to form the opening by precision machining using a laser or the like. The present invention thus provides a very superior method.

The beam intensity converting film herein may be any beam intensity converting film, provided that the beam intensity converting film has an opening which allows passage of a charged particle beam and that the intensity is different between an incident charged particle beam and an outgoing charged particle beam. Such a beam converting film is, for example, an attenuator to attenuate the energy of a charged particle beam, a scraper to adjust the beam size of a charged particle beam, or the like.

Embodiment 1

The following description will discuss one embodiment of the present invention in detail. FIG. 1 schematically illustrates an attenuator (beam intensity converting film) 1 in accordance with Embodiment 1. (a) of FIG. 1 is a cross-sectional view, and (b) of FIG. 1 is a front view showing the surface from which a charged particle beam travels outward.

As illustrated in (a) of FIG. 1, the attenuator 1 in accordance with Embodiment 1 has openings 1a that allow passage of a charged particle beam X. The attenuator 1 is a film that serves to attenuate the intensity of the charged particle beam X incident thereon, and is placed such that its surface intersects the optical axis of the charged particle beam X. The attenuator 1 is constituted by one or more graphite films, each of which has a thickness of 1 µm or greater. In the attenuator 1, portion, where no openings 1a exist, of the attenuator 1 serves to shield against the charged particle beam X. Therefore, the attenuator 1 needs to be thick to an extent that charged particles do not penetrate through the attenuator 1. The thickness of a graphite film required to totally shield against charged particles differs depending on the intensity of the charged particle beam X. In a case of a high-intensity beam, the thickness of a graphite film required to totally shield against the beam is large, whereas, in a case of a low-intensity beam, the thickness of a graphite film required to totally shield against the beam is small. In a case of a charged particle beam X with a relatively low intensity of about 1 MeV, such a beam can be significantly shielded against by a graphite film equal to or greater than 1 µm in thickness.

The charged particle beam X, after emitted from a charged particle beam source (not illustrated), is incident on the attenuator 1. The charged particle beam X passes through an opening 1a in the attenuator 1, but is shielded against by the portion of the attenuator 1 where no openings 1a exist. As such, a charged particle beam X's component that has passed through the opening 1a travels outward from the attenuator 1. In this way, the intensity of the charged particle beam X is attenuated by the attenuator 1. It should be noted that, although the charged particle beam X is non-uniform in intensity for a while after passage through the opening of the attenuator 1, the uneven distribution will become uniform afterwards and provide a desirably attenuated beam intensity.

The extent of attenuation of the charged particle beam X through the attenuator 1 depends on the open area ratio (the ratio of the area of opening(s) 1a to the area of a surface of the attenuator 1) of the attenuator 1. The open area ratio of the attenuator 1 can therefore be selected appropriately depending on a desired intensity of the charged particle beam X. Given the strength and the like of a graphite film constituting the attenuator 1, the open area ratio of the attenuator 1 can be selected from the range of from 1% to 80%.

As illustrated in (b) of FIG. 1, the openings 1a of the attenuator 1 are in the form of slits (in the form of blinds). The openings 1a need only be configured such that the openings 1a pass through the attenuator 1 from the surface on which the charged particle beam X is incident to the surface from which the charged particle beam X travels outward, and are not limited to the configuration as illustrated in (b) of FIG. 1. The openings 1a may be, for example, through-holes like punched holes or may be in the form of a mesh structure.

An opening may be constituted with the use of a plurality of attenuators. For example, in a case where a plurality of attenuators 1 each having openings 1a as illustrated in FIG. 1 are used, the open area ratio can be adjusted by changing the relative positions of the attenuators 1.

The following discusses an example in which two attenuators 1 each having openings 1a in the form of slits are used. The attenuators 1 in this example each have an open area ratio of 50%, and are arranged such that openings 1a of one attenuator 1 and openings 1a of the other attenuator 1 are coincident with each other. In this case, by rotating the two attenuators 1 relative to each other and thereby changing the angle between each opening 1a of one attenuator 1 and its corresponding opening 1a of the other attenuator 1, it is possible to adjust the open area ratio. When the two attenuators 1 are arranged such that their openings 1a are at a right angle to each other, the open area ratio is 25%. Therefore, in a case where two attenuators 1 having openings 1a coincident with each other are used, the open area ratio can be adjusted within the range of from 25% to 50% by rotating the two attenuators 1 relative to each other.

Alternatively, in a case where two attenuators 1 are adjusted such that their openings 1a do not overlap each other, that is, in a case where two attenuators 1 are adjusted such that each opening 1a of one attenuator 1 overlaps the portion where no openings 1a exist (shielding portion) of the other attenuator 1, the open area ratio is 0%. By rotating the two attenuators 1 relative to each other, it is possible to adjust the open area ratio within the range of from 0% to 25%.

(Graphite Film Constituting Attenuator 1)

A graphite film constituting the attenuator 1 needs to be thick to an extent that the charged particle beam X is shielded against by the portion, where no openings exist, of the graphite film constituting the attenuator 1 and that charged particles do not penetrate through that portion. A graphite film greater than 1 µm in thickness is capable of significantly shielding against a low-energy charged particle beam X. On the other hand, in order to totally shield against a higher-energy charged particle beam, the graphite film needs to be thicker. In such a case, it is effective to use a method of preparing a thicker film by: stacking a plurality of graphite films for use in Embodiment 1; and, for example, heating the stack under pressure. In general, it is extremely difficult to prepare a thick graphite film that is highly oriented and that has high crystallinity such as those for use in Embodiment 1. However, by stacking a plurality of graphite films for use in Embodiment 1 together, possible to prepare an attenuator that is highly oriented, that has high crystallinity, and that is equal to or greater than 100 µm in thickness.

A graphite film in Embodiment 1 is characterized in that it has high crystallinity and is highly oriented, and that the basal (net) planes of graphite constituting the graphite film are parallel to a surface of the graphite film. Such an orientation can be evaluated on the basis of a thermal conductivity of the graphite film. A graphite film in Embodiment 1 is characterized in that the thermal conductivity in a surface direction is equal to or greater than 20 times the thermal conductivity in the thickness direction. Other configurations of the graphite film are not particularly limited, provided that the thermal conductivity in the surface direction is greater than 20 times the thermal conductivity in the thickness direction.

A graphite film constituting the attenuator 1 is equal to or greater than 1 μm in thickness, and the orientation of the graphite can be evaluated also on the basis of an electric conductivity of the graphite film. A graphite film in Embodiment 1 is characterized in that the electric conductivity in the surface direction is equal to or greater than 100 times the thermal conductivity in an electrical direction. Other configurations of the graphite film are not particularly limited, provided that the electric conductivity in the surface direction is greater than 100 times the thermal conductivity in an electrical direction.

It should be noted that, since the measurement of electric conductivity is very easy as compared to thermal conductivity, measuring electric conductivity characteristics is a very effective method in managing the performance of a graphite film.

The open area ratio of a graphite film(s) constituting the attenuator 1 is 1% to 80%. Provided that the open area ratio falls within this range, the shape of the opening(s) and the method of making the opening(s) are not particularly limited.

Furthermore, a graphite film constituting the attenuator 1 preferably has a thermal conductivity in the surface direction of 1000 W/(m·K) or greater, from the viewpoint of high heat dissipation performance, high durability, and excellent mechanical strength. Such a graphite film is preferred, because such a graphite film has high strength and high thermal conductivity. The term "thickness" as used herein means a dimension of the attenuator 1 along the direction in which the charged particle beam X passes through the attenuator 1.

A graphite film constituting the attenuator 1 preferably has an electric conductivity in the surface direction of 12000 S/cm or greater, from the viewpoint of high quality, high durability, and excellent mechanical strength.

The attenuator 1 in the accelerator is replaced at various time intervals depending on the open area ratio, location, and/or the like. In a case where the attenuator 1 and an apparatus near the attenuator 1 have become radioactive at the time of replacement of the attenuator 1, a worker is at a risk of exposure to radiation. Furthermore, in a case where these members become radioactive, disposal of these members as radioactive waste, for example, will be a problem. If the quantity of heat generated in the attenuator 1 is large during usage of the attenuator 1, the generated heat causes an increase in extent of radioactivation, and not only the attenuator 1 but also members near the attenuator 1 become radioactive. Therefore, preventing heat generation during the emission of a charged particle beam X by employing an attenuator 1 having a high heat dissipation performance is very important in order not only to merely increase the lifetime of the attenuator 1 but also to prevent radioactivation of apparatuses near the attenuator 1.

(Method of Producing Graphite Film)

A method of producing a graphite film in accordance with Embodiment 1 is not particularly limited, and is, for example, a method of preparing a graphite film by treating a polymeric film with heat. Specifically, a method of producing a graphite film of one example of Embodiment 1 includes a carbonizing step including carbonizing an aromatic polyimide film and a graphitizing step including graphitizing the carbonized aromatic polyimide film.

<Carbonizing Step>

The carbonizing step involves carrying out carbonization by preheating an aromatic polyimide film, which is a starting material, under reduced pressure or in nitrogen gas. The heat treatment temperature for carbonization is preferably 500° C. or above, more preferably at 600° C. or above, most preferably 700° C. or above. During the carbonization, a pressure may be applied to the film along the thickness direction of the film or a tensile force may be applied to the film along a direction parallel to the surface of the film to the extent that the film is not damaged, in order to prevent wrinkles from forming in the starting polymeric film.

<Graphitizing Step>

In the graphitizing step, graphitization may be carried out after removing the carbonized polyimide film from a furnace and then transferring it to a graphitization furnace, or carbonization and graphitization may be carried out continuously. The graphitization is carried out under reduced pressure or in an inert gas. Suitable inert gases are argon and helium. The treatment may be carried out until the heat treatment temperature (firing temperature) reaches 2400° C. or above, preferably 2600° C. or above, more preferably 2800° C. or above, most preferably 3000° C. or above. In the graphitizing step, a pressure may be applied along the thickness direction of the film, and/or a tensile force may be applied to the film along a direction parallel to the surface of the film.

According to the above method, it is possible to obtain a graphite film that has a good graphite crystal structure and that is highly thermally conductive and highly electrically conductive.

A polymeric film for use in Embodiment 1 is not particularly limited, provided that it can be converted, by carbonization, graphitization, or a combination of carbonization and graphitization, into a graphite film whose anisotropies in thermal conductivity and electric conductivity between the surface and thickness directions fall within the foregoing ranges. The polymeric film is, for example, a polymeric film of at least one polymer selected from aromatic polyimides, aromatic polyamides, polyoxadiazoles, polybenzothiazoles, polybenzobisthiazoles, polybenzoxazoles, polybenzobisoxasoles, polyparaphenylene vinylenes, polybenzimidazoles, polybenzobisimidazoles, and polybenzothiazoles. A particularly preferable raw material film for the graphite film of Embodiment 1 is an aromatic polyimide film.

(Thermal Conductivity in Surface Direction of Graphite Film)

In a graphite film for use in Embodiment 1, the anisotropy in thermal conductivity between surface and thickness directions is equal to or greater than 20 times, more preferably equal to or greater than 30 times, most preferably equal to or greater than 50 times. The term "anisotropy in thermal conductivity between surface and thickness directions" as used herein refers to the ratio of thermal conductivity in the surface direction to thermal conductivity in the thickness direction (that is, thermal conductivity in surface direction/thermal conductivity in thickness direction).

In regard to specific values of the thermal conductivity in the surface direction, the thermal conductivity in the surface direction is equal to or greater than 1000 W/(m·K), preferably equal to or greater than 1200 W/(m·K), more preferably equal to of greater than 1400 W/(m·K), even more preferably equal to or greater than 1600 W/(m·K).

A graphite film having a thermal conductivity in the surface direction of 1000 W/(m·K) or greater provides a graphite film having a better heat dissipation performance. A graphite film having a thermal conductivity in the surface direction of 1000 W/(m·K) or greater means that the thermal conductivity of this graphite film is equal to or greater than 2.5 to 4 times that of a metal material (for example, copper, aluminum).

The thermal conductivity in the surface direction of a graphite film is calculated using the following equation (1):

$$A = \alpha \times d \times Cp \quad (1)$$

where A represents the thermal conductivity in the surface direction of the graphite film, α represents the thermal diffusivity in the surface direction of the graphite film, d represents the density of the graphite film, and Cp represents the specific heat capacity of the graphite film. The density, the thermal diffusivity, and the specific heat capacity in the surface direction of the graphite film are obtained in the following manner.

The density of a graphite film is measured in the following manner: a sample measuring 100 mm×100 mm cut from the graphite film is measured for weight and thickness; and the measured value of the weight is divided by the value of volume (calculated from 100 mm×100 mm×thickness).

The specific heat capacity of a graphite film was measured with the use of a differential scanning calorimeter DSC220CU, which is a thermal analysis system manufactured by SII NanoTechnology Inc., in the condition in which temperature was raised from 20° C. to 260° C. at 10° C./min.

The thermal conductivity in the thickness direction of the graphite film can be calculated in the same manner as described above using the foregoing equation (1), except that α in the equation is the thermal diffusivity in the thickness direction of the graphite film.

The thermal diffusivity in the surface direction of the graphite film was measured with the use of a commercially-available thermal diffusivity measuring instrument using a light alternating-current method (for example, "LaserPIT" available from ULVAC RIKO, Inc.). For example, a sample measuring 4 mm×40 mm cut from the graphite film was measured in an atmosphere of 20° C. at a laser frequency of 10 Hz.

The thermal diffusivity in the thickness direction of the graphite film is determined by a pulse heating method using a laser. In this method, a laser is shined on one surface of the film and thereby the film is heated, and thereafter a temperature response (temperature change) at the opposite surface of the film is measured. Then, half-time ($t_{1/2}$) of time (t) taken for the temperature to reach a certain temperature is calculated using the following equation (2):

$$\alpha = \frac{d^2}{\tau_0} = 0.1388 \times \frac{d^2}{t_{1/2}} \quad (2)$$

where α represents thermal diffusivity, $t_0$ represents the period of thermal diffusion, d represents the thickness of a sample, $t_{1/2}$ represents half-time, and 0.1388 is the apparatus constant of the apparatus used.

(Thickness of Graphite Film)

The thickness of a graphite film in accordance with Embodiment 1 is 1 μm or greater, more preferably 2 μm or greater and 1 mm or less, particularly preferably 3 μm or greater and 500 μm or less. A graphite film having such a thickness is preferred, because the attenuator 1 increases in temperature to a lesser extent even upon irradiation with a charged particle beam and, as a result, apparatuses near the attenuator 1 do not easily become radioactive. It is difficult, by a polymer firing method, to prepare a graphite film that has physical properties falling within the ranges of Embodiment 1 and that has a thickness equal to or greater than 50 μm. In such a case, a plurality of graphite films may be pressed together. It is also effective to prepare a thick graphite film by press-bonding the graphite films. For example, for preparing a graphite film having a thickness of 200 μm, four graphite films each having a thickness of 50 μm may be pressed together or press-bonded together. By pressing or press-bonding ten graphite films together, it is possible to prepare a graphite film having a thickness of 500 μm.

The thickness of a graphite film is measured in the following manner: thicknesses at any ten locations of a sample measuring 50 mm×50 mm cut from the graphite film are measured in a thermostatic chamber at 25° C. with the use of a thickness gage (HEIDENHAIN-CERTO, manufactured by HEIDENHAIN); and the mean of the thicknesses is used as the thickness of the graphite film.

(Electric Conductivity in Surface Direction of Graphite Film)

The electric conductivity in the surface direction of a graphite film in Embodiment 1 is not particularly limited, and is preferably 12000 S/cm or greater, preferably 14000 S/cm or greater, more preferably 16000 S/cm or greater, most preferably 18000 S/cm or greater.

Furthermore, the graphite film preferably has anisotropy (orientation) such that the electric conductivity in the surface direction of the graphite film is equal to or greater than 100 times the electric conductivity in the thickness direction of the graphite film.

The electrical conductivity of a graphite film is measured by applying a constant current in a four-point probe method (for example, by using Loresta-GP, manufactured by Mitsubishi Chemical Analytech Co., Ltd.)

(Density of Graphite Film)

The density of a graphite film in Embodiment 1 is not particularly limited, and is preferably 1.70 g/cm³ or greater, preferably 1.80 g/cm³ or greater more preferably 1.90 g/cm³ or greater, more preferably 2.00 g/cm³ or greater. A graphite film having a density of 1.60 g/cm³ or greater is preferred, because such a graphite film has an excellent self-supporting property and excellent mechanical strength properties.

Furthermore, since a graphite film having a greater density has a higher possibility of interacting with a charged particle beam, a graphite film having a high density is highly effective as an attenuator. In addition, a graphite film having a high density has little gap between its constituent graphite layers, and therefore such a graphite film tends to have a high thermal conductivity. In a case where a graphite film has a low density, such a graphite film has a poor efficiency in decelerating a charged particle beam, and, in addition, the graphite film also has a decreased thermal conductivity due to the effects of air layers bet n the constituent graphite layers. This is therefore not preferred. It is also inferred that, in the air layers (hollow portions), thermal conductivity is poor and thus heat is likely to be trapped in these portions, or that the air layers in the hollow portions expand due to temperature increase caused by heat. Therefore, a graphite film having a low density easily deteriorates and/or is damaged. Furthermore, in a case where a graphite film has a high density, a charged particle beam is less likely to be scattered when passing through the graphite film. Therefore, in the case of a graphite film having a high density, a charged particle beam is less likely to be scattered even in a case where such graphite films are stacked together. In view of these matters, the graphite film preferably has a high density. Specifically, the density is preferably 1.70 g/cm$^3$ or greater, preferably 1.80 g/cm$^3$ or greater, more preferably 1.80 g/cm$^3$ or greater, more preferably 1.90 g/cm$^3$ or greater, more preferably 2.00 g/cm$^3$ or greater, more preferably 2.10 g/cm$^3$ or greater. In regard to the upper limit of the density of the graphite film, the density of the graphite film is 2.26 g/cm$^3$ (theoretical value) or less, and may be 2.24 g/cm$^3$ or less.

The density of a graphite film is measured in the following manner: a sample measuring 100 mm×100 mm cut from the graphite film is measured for weight and thickness; and the measured value of the weight is divided by the value of volume (calculated from 100 mm×100 mm×thickness).

(Formation of Opening)

A graphite film constituting the beam intensity converting film of Embodiment 1 preferably has an open area ratio in the range of from 1% to 80%. The open area ratio is not limited to a particular value, provided that the open area ratio falls within the above preferred range. The open area ratio is more preferably in the range of from 2% to 70%, even more preferably in the range of from 5% to 60%, most preferably in the range of from 10% to 50%.

A method of forming an opening is not particularly limited, and machining using a laser or the like, mechanical machining, or the like may be used depending on need. In particular, in graphite made of carbon, it is possible to form an opening that is in a desired shape and that provides a desired open area ratio, by laser machining. Machining using a laser is carried out preferably in air. When laser machining is carried out in air, carbon dissipates as carbon dioxide gas and an opening can be easily formed. A laser for use in machining is not particularly limited, provided that machining of graphite can be achieved.

The shape of the opening is not particularly limited as well. The shape of the opening can be freely selected from the foregoing blind shape, hole shape, mesh form, and the like.

(Mechanical Strength of Graphite Film)

A graphite film in Embodiment 1 is superior also in terms of mechanical strength. A graphite film of one embodiment of the present invention is used as a self supporting film, but can be attached to a metal frame or can be sandwiched between two metal frames.

One method to evaluate a graphite film having a thickness in the range of from 1 μm to 50 μm, within which the mechanical strength is an issue, is a folding endurance test. The number of times a graphite film having a thickness within the above range is folded in an MIT folding endurance test may be preferably 100 or more, more preferably 200 or more, even more preferably 500 or more, particularly preferably 1000 or more.

The MIT folding endurance test for a graphite film is carried out in the following manner. Three test pieces each measuring 1.5×10 cm are removed from the graphite film. The test is carried out with the use of an MIT crease-flex fatigue resistance tester Model D manufactured by Toyo Seiki Seisaku-sho, Ltd. under the conditions in which test load is 100 gf (0.98 N), speed is 90 times/min., and radius of curvature R of folding clamp is 2 mm. The graphite film is folded to an angle of 135° in either direction in an atmosphere of 23° C., and the number of times the graphite film is folded before the graphite film is severed is counted.

In the configuration illustrated in FIG. 1, the attenuator 1 is constituted by a single graphite film. Note, however, that the attenuator 1 may be constituted by a plurality of graphite films.

The attenuator 1 may be a stack of graphite films so as to have a thickness that is durable against a higher-energy charged particle beam X. Such a stack can be prepared by laminating, by a method such as press bonding, a plurality of graphite films each having a thickness of from 1 μm to 50 μm produced through the foregoing method. This provides an attenuator 1 that is equal to or greater than 50 μm in thickness and that has excellent characteristics such as excellent thermal conductivity in the surface direction.

The thickness of the beam intensity converting film constituted by such a stack is not particularly limited. In order to prepare a beam intensity converting film equal to or greater than 100 μm in thickness, employing a multilayer structure is usually very effective.

In a case where the attenuator 1 is constituted by a plurality of graphite films, the graphite films in an accelerator may be provided separately from each other. In this case, the graphite films are configured such that their open area ratios correspond to respective desired energy intensities of charged particle beams X. The positions of the respective graphite films can be appropriately determined according to the type of experiment using a charged particle beam(s) X or the configuration of the accelerator. For example, the graphite films may be positioned such that they all intersect the same beam axis of the charged particle beam X, or may be positioned such that the graphite films intersect a respective plurality of beam axes of charged particle beams X in one-to-one correspondence.

Embodiment 2

Figure 2:
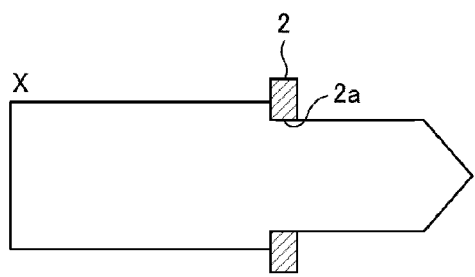
FIG. 2 is a cross-sectional view schematically illustrating a configuration of a scraper serving as a beam intensity converting film in accordance with Embodiment 2 of the present invention.

The following description will discusses another embodiment of the present invention with reference to FIG. 2. For convenience, members having functions identical to those described in Embodiment 1 are assigned identical referential numerals and their descriptions are omitted here.

A beam intensity converting film in accordance with Embodiment 2 is different from that of Embodiment 1 in that the beam intensity converting film in accordance with Embodiment 2 is a scraper. FIG. 2 is a cross-sectional view schematically illustrating a configuration of a scraper 2 serving as a beam intensity converting film in accordance with Embodiment 2.

As illustrated in FIG. 2, the scraper 2 (beam intensity converting film) in accordance with Embodiment 2 has an opening 2a. The scraper 2 is a film that serves to reduce the beam size of an incident charged particle beam X, and is placed such that a surface thereof intersects the optical axis of the charged particle beam X. The scraper 2 is constituted by one or more graphite films, each of which is equal to or greater than 1 μm in thickness.

The charged particle beam X, after emitted from a charged particle beam source (not illustrated), is incident on the scraper 2. The charged particle beam X passes through the central portion of the scraper 2 where the opening 2a exists, but is shielded against by the peripheral portion of the scraper 2 where no opening 2a exists.

As such, only a charged particle beam X's component incident on the central portion of the scraper 2 where the opening 2a exits passes through and travels outward from the scraper 2. On the other hand, a charged particle beam X's component of relatively low energy, which is incident on the peripheral portion of the scraper 2 where no opening 2a exists, is shielded against b the scraper 2. Thus, the charged particle beam X's peripheral component, which has a relatively low energy, is removed by the scraper 2, and this provides a charged particle beam X of a smaller size with uniform intensity.

(Energy of Charged Particle Beam in Embodiments 1 and 2)

A charged particle beam, which is incident on a beam intensity converting film (attenuator 1, scraper 2, or the like) constituted by a graphite film(s), partially passes through an opening of the beam intensity converting film and is partially shielded against by the portion where no openings exist. The energy of a charged particle beam X, which is to be shielded against by a beam intensity converting film, differs depending on the accelerator.

The collision stopping power (energy loss) of a target material (in this case, the beam intensity converting film) for a charged particle is represented by the following Bethe equation (equation (3)):

$$S_{col} = -\frac{4\pi e^4 z^2 N}{mv^2} Z \left[ \ln \frac{2mv^2}{I(1-\beta^2)} - \beta^2 \right] \quad (3)$$

where e represents elementary charge of electron, m represents mass of electron, v represents velocity of electron, z represents nuclear charge of incident particle, Z represents the atomic number of the target material, N represents the number of atoms per unit volume of the target material, I represents the mean excitation potential of the target material, and β represents v/c where c is the speed of light.

Figure 3:
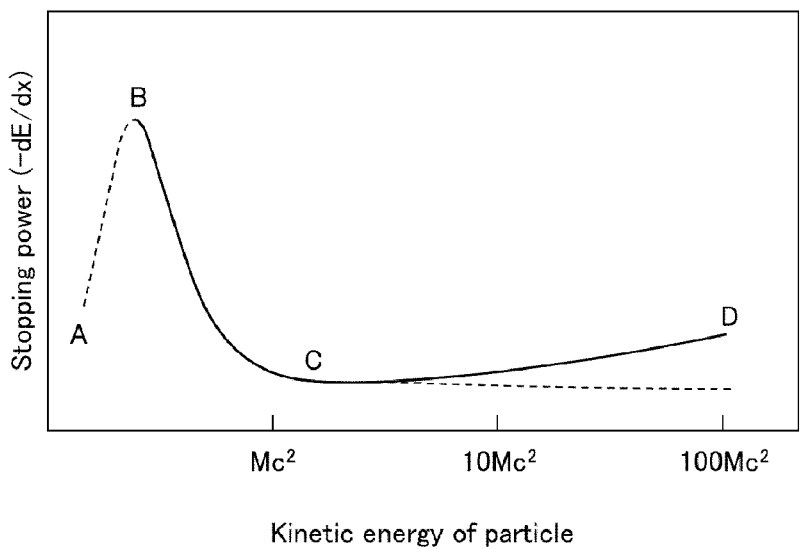
FIG. 3 is a graph showing the relationship between the stopping power based on the Bethe equation and kinetic energy of particle.

FIG. 3 is a graph showing the relationship between the stopping power based on the Bethe equation (equation (3)) and kinetic energy of particle. As illustrated in FIG. 3, the collision stopping power (energy loss) of a target material for a charged particle increases from A (kinetic energy of particle is low) to B and reaches maximum at B. Then, the stopping power decreases from B to C in proportion to $1/v^2$, and reaches minimum at C. Then, the stopping power gradually increases from C to D, where logarithms of the Bethe equation (equation (3)) are effective.

The charged particle beam X received by a beam intensity converting film (attenuator 1, scraper 2, or the like) in Embodiments 1 and 2 is, in many cases, a charged particle beam falling within the energy range of from A to C, which is a relatively low energy range. However, the fact that the beam intensity converting film is used in a relatively low energy range does not mean that the intensity converting film does not require high durability. The energy of the charged particle beam X at B is on the order of MeV (for example, 1 MeV), and the energy of the charged particle beam X at C is on the order of GeV (for example, 3 GeV). The stopping power of the target material at B is about 100 times as high as the stopping power of the target material at C. This means that the energy of charged particles is converted into heat and effectively lost within the target material. Therefore, an intensity converting film for use in the energy range of from B to C, which is for use in one embodiment of the present invention, is required to be highly durable. The number of charged particles differs depending on each accelerator, and therefore the stopping power is not the only factor that determines the durability necessary for the intensity converting film. However, in the energy range of 1 to 100 MeV, which is the major application of the intensity converting film in Embodiments 1 and 2, the intensity converting film is undoubtedly required to be highly durable. Under such severe conditions, the foregoing graphite films constituting the beam intensity converting films of Embodiments 1 and 2 can satisfy the above requirement, provided that the graphite films have physical properties and thickness falling within the foregoing ranges.

The present invention not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

[Recap]

A beam intensity converting film in accordance with one embodiment of the present invention is a beam intensity converting film having an opening that allows passage of a charged particle beam, the beam intensity converting film including one or more graphite films placed such that a surface thereof intersects a beam axis of the charged particle beam, wherein the one or more graphite films each have a thickness of 1 μm or greater, and wherein, in the one or more graphite films, a thermal conductivity in a surface direction is equal to or greater than 20 times a thermal conductivity in a thickness direction.

According to the above configuration, each of the graphite films is equal to or greater than 1 μm in thickness, and thus has a sufficient shielding ability against charged beams, mechanical strength sufficient for actual use, and sufficient durability. Furthermore, according to the above arrangement, the one or more graphite films have the following characteristic: the thermal conductivity in the surface direction of a graphite film is equal to or greater than 20 times the thermal conductivity in the thickness direction of the graphite film. This characteristic is one of the indicators for the degree of orientation, and indicates that the one or more graphite films in the beam intensity converting film in accordance with one embodiment of the present invention are highly oriented. A graphite film having such a configuration is basically made only of carbon, and therefore the extent of radioactivity of the film itself can be reduced. Furthermore, since heat generated by beam irradiation is smoothly diffused in the surface direction and thereby the temperature rise of the intensity converting film is prevented, the durability of the intensity converting film improves. In addition, preventing or reducing temperature rise also makes it possible to reduce the extent of radioactivation of apparatuses near the intensity converting film, as described later.

Furthermore, the foregoing characteristic concerning thermal conductivity (anisotropy in thermal conductivity) also indicates that the graphite film has a high crystallinity. A graphite film in accordance with one embodiment of the present invention can therefore have high heat resistance. Graphite with high crystallinity has an excellent heat resistance at temperatures equal to and above 3000° C. in vacuum, and thus has a superior durability against charged particle beams to conventional intensity converting films made of titanium.

A beam intensity converting film in accordance with one embodiment of the present invention is a beam intensity converting film having an opening that allows passage of a charged particle beam, the beam intensity converting film including one or more graphite films placed such that a surface thereof intersects a beam axis of the charged particle beam, wherein the one or more graphite films each have a thickness of 1 µm or greater, and wherein, in the one or more graphite films, an electric conductivity in a surface direction is equal to or greater than 100 times an electric conductivity in a thickness direction.

According to the above configuration, the one or more graphite films have the following characteristic: the electric conductivity in the surface direction of a graphite film is equal to or greater than 100 times the electric conductivity in the thickness direction of the graphite film. This characteristic is one of the indicators for the degree of orientation, and indicates that the one or more graphite films in the beam intensity converting film in accordance with one embodiment of the present invention have high crystallinity and are highly oriented. Thus, the above configuration makes it possible to provide a beam intensity converting film that is made of carbon, that is sufficiently durable against charged particle beams, and that can reduce the extent of radioactivation.

Furthermore, since the measurement of electric conductivity is very easy as compared to thermal conductivity, measuring electric conductivity characteristics is a very effective method in managing the performance of a graphite film. Such an anisotropy in electric conductivity is also an indicator that indicates that the graphite film has high crystallinity. As such, the graphite film can have high heat resistance.

The beam intensity converting film in accordance with one embodiment of the present invention is preferably arranged such that, in each of the one or more graphite films, the thermal conductivity in the surface direction is 1000 W/(m·K) or greater. Such a high thermal conductivity in the surface direction reduces the temperature rise of the film, and this achieves a reduction in extent to which apparatuses near the intensity converting film become radioactive due to beam reflection by the intensity converting film, for the reasons described later.

The beam intensity converting film in accordance with one embodiment of the present invention is preferably arranged such that, in the one or more graphite films, the electric conductivity in the surface direction is 12000 S/cm or greater. Since the measurement of electric conductivity is very easy as compared to thermal conductivity, measuring electric conductivity characteristics is a very effective method in managing the performance of a graphite film.

The beam intensity converting film in accordance with one embodiment of the present invention is preferably arranged such that the one or more graphite films have an open area ratio of 1 to 80%.

The beam intensity converting film in accordance with one embodiment of the present invention may be arranged such that the one or ore graphite films are two or more graphite films, and that the beam intensity converting film includes a stack of the two or more graphite films. As a graphite film becomes thicker, the shielding ability and durability of the intensity converting film against charged particle beam irradiation improve. Furthermore, the above stack, which is a stack of two or more graphite films of the present invention, may be prepared by press-bonding by a hot press method or the like method. This makes it possible to prepare an intensity converting film having a desired thickness. The thickness of a beam intensity converting film constituted by such a stack is not particularly limited, but employing such a multilayer structure is usually very effective in order to prepare a beam intensity converting film equal to or greater than 100 µm in thickness.

The beam intensity converting film in accordance with one embodiment of the present invention is preferably arranged such the one or more graphite films have a density of 1.70 g/cm$^3$ or greater and 2.26 g/cm$^3$ or less.

A method of producing a beam intensity converting film in accordance with one embodiment of the present invention is a method of producing a beam intensity converting film having an opening that allows passage of a charged particle beam, the beam intensity converting film including one or more graphite films, the method including a step of preparing the one or more graphite films by firing one or more polymeric films.

According to the above arrangement, it is possible to provide a method of producing a beam intensity converting film that has sufficient shielding ability and sufficient durability against charged particle beams and that can reduce the extent of radioactivation.

INDUSTRIAL APPLICABILITY

The present invention can be used in the fields in which an accelerator is used.

REFERENCE SIGNS LIST

1 Attenuator (beam intensity converting film)
1a Opening
2 Scraper (beam intensity converting film)
2a Opening

The invention claimed is:
1. A beam intensity converting film comprising
one or more graphite films placed such that a surface thereof intersects a beam axis of a charged particle beam,
wherein the one or more graphite films have an opening that allows passage of the charged particle beam,
wherein the one or more graphite films each have a thickness of 1 µm or greater,
wherein, in the one or more graphite films, a thermal conductivity in a surface direction is equal to or greater than 20 times a thermal conductivity in a thickness direction,
wherein, in the one or more graphite films, an electric conductivity in a surface direction is equal to or greater than 100 times an electric conductivity in a thickness direction,
wherein, in the one or more graphite films, the electric conductivity in the surface direction is 18000 S/cm or greater, and
wherein the one or more graphite films have an open area ratio of 10 to 50%, wherein the open area ratio is a ratio of an area of the opening to an area of a surface of the one or more graphite films.
2. The beam intensity converting film according to claim 1, wherein, in each of the one or more graphite films, the thermal conductivity in the surface direction is 1000 W/(m·K) or greater.
3. The beam intensity converting film according to claim 2, wherein, in each of the one or more graphite films, the thermal conductivity in the surface direction is 1600 W/(m·K) or greater.
4. The beam intensity converting film according to claim 1, wherein the one or more graphite films have a density of 1.70 g/cm$^3$ or greater and 2.26 g/cm$^3$ or less.
5. The beam intensity converting film according to claim 4, wherein the one or more graphite films have a density of 2.00 g/cm$^3$ or greater and 2.26 g/cm$^3$ or less.

6. The beam intensity converting film according to claim 1, wherein the one or more graphite films are two or more graphite films, and the beam intensity converting film includes a stack of the two or more graphite films.

7. The beam intensity converting film according to claim 1, wherein the number of times each of the one or more graphite films is folded in an MIT folding endurance test is 1000 or more.

8. A method of producing a beam intensity converting film including one or more graphite films, the method comprising
- a step of preparing the one or more graphite films by heat treating one or more polymeric films in a furnace,
- wherein the one or more graphite films have an opening that allows passage of a charged particle beam;
- wherein the one or more graphite films each have a thickness of 1 μm or greater,
- wherein, in the one or more graphite films, a thermal conductivity in a surface direction is equal to or greater than 20 times a thermal conductivity in a thickness direction,
- wherein, in the one or more graphite films, an electric conductivity in a surface direction is equal to or greater than 100 times an electric conductivity in a thickness direction,
- wherein, in the one or more graphite films, the electric conductivity in the surface direction is 18000 S/cm or greater, and
- wherein the one or more graphite films have an open area ratio of 10 to 50%, wherein the open area ratio is a ratio of an area of the opening to an area of a surface of the one or more graphite films.

\* \* \* \* \*